United States Patent [19]
Chan et al.

[11] Patent Number: 5,489,797
[45] Date of Patent: Feb. 6, 1996

[54] LOCAL INTERCONNECT STRUCTURE

[75] Inventors: Tsiu C. Chan, Carollton; Frank R. Bryant, Denton; John L. Walters, Carrollton, all of Tex.

[73] Assignee: SGS-Thomson Microelectronics, Inc., Carrollton, Tex.

[21] Appl. No.: 420,353

[22] Filed: Apr. 11, 1995

Related U.S. Application Data

[62] Division of Ser. No. 359,006, Dec. 19, 1994.

[51] Int. Cl.$^6$ .......................... H01L 29/76; H01L 29/94; H01L 27/11
[52] U.S. Cl. .......................... 257/382; 257/384; 257/385; 257/412; 257/754; 257/755; 257/756; 257/758; 257/903
[58] Field of Search ...................... 257/382, 384, 257/385, 412, 754, 755, 756, 758, 903

[56] References Cited

U.S. PATENT DOCUMENTS

| | | | |
|---|---|---|---|
| 4,703,552 | 11/1987 | Baldi et al. | 437/57 |
| 4,975,756 | 12/1990 | Haken et al. | 257/371 |
| 5,010,032 | 4/1991 | Tang et al. | 437/192 |
| 5,065,225 | 11/1991 | Bryant et al. | 257/30 |
| 5,086,006 | 2/1992 | Asahina | 437/57 |
| 5,089,429 | 2/1992 | Hsu | 437/57 |
| 5,173,450 | 12/1992 | Wei | 437/190 |
| 5,182,627 | 1/1993 | Chan et al. | 257/755 |
| 5,190,886 | 3/1993 | Asahina | 437/192 |
| 5,204,279 | 4/1993 | Chan et al. | 437/57 |
| 5,223,456 | 6/1993 | Malwah | 437/207 |
| 5,416,352 | 5/1955 | Takada | 257/413 |
| 5,422,499 | 6/1995 | Manning | 257/67 |
| 5,436,506 | 7/1995 | Kim et al. | 257/347 |

*Primary Examiner*—Ngân V. Ngô
*Attorney, Agent, or Firm*—Kenneth C. Hill; Lisa K. Jorgenson; Richard K. Robinson

[57] ABSTRACT

An interconnect structure, and method for forming same, is suitable for use in integrated circuits such as SRAM devices. The structure uses masking of a polycrystalline silicon interconnect level to move a P-N junction to a region within a polycrystalline silicon interconnect line, rather than at the substrate. This P-N junction can then be shorted out using a refractory metal silicide formed on the polycrystalline silicon interconnect structure.

7 Claims, 2 Drawing Sheets

LOCAL INTERCONNECT STRUCTURE

This is a division of application Ser. No. 08/359,006, filed Dec. 19, 1994.

BACKGROUND OF THE INVENTION

1. Field of the Invention

The present invention relates generally to semiconductor integrated circuits, and more specifically to an interconnect structure and method for forming the structure.

2. Description of the Prior Art

In CMOS integrated circuits, various conductive structures are doped with P-type or N-type impurities. In order to interconnect these structures, at some point a P-N junction must be formed where the P-type and N-type conductive structures come together. As is known in the art, this junction causes a voltage drop of approximately 0.7 volts when biased in the forward direction.

In contemporary high density, low voltage integrated circuits, such as high density SRAMs, the presence of such a P-N junction may interfere with proper operation of the circuit. This is especially true as operating voltages for these devices increasingly move from 5 volt supplies to 3.3 volt, and lower, supplies. For example, FIG. 1 illustrates a portion of a CMOS memory cell. The access transistors are not shown in FIG. 1; only the cross-coupled latch portion of the cell is illustrated.

Referring to FIG. 1, a portion of a prior art SRAM cell 10 is illustrated. Cell 10 includes P-channel transistors 12, 14, and N-channel transistors 16, 18. The gates of transistors 12 and 16 are connected together, and connected to a common electrical node 20. In a similar manner, the gates of transistors 14 and 18 are connected together, and in turn connected to a common electrical node 22. The access transistors (not shown) are connected to signal lines 24 and 26.

The P-channel transistors 12, 14 have heavily doped, P-type, source and drain regions. In a typical embodiment, the connection between the gates of transistors 14 and 18, and the drain of transistor 12 is made by a polycrystalline silicon signal line 28. This signal line 28 is doped N-type for conductivity, and a P-N diode 30 is formed at the point where the polycrystalline silicon signal line 28 contacts the heavily doped drain. In a similar manner, a polycrystalline silicon signal line 32 connects the gates of transistors 12 and 16 to the drain of transistor 14. A diode 34 is also formed at the junction between the N-type doped signal line 32 and the P-type drain of transistor 14.

In some respects, diodes 30 and 34 do not adversely affect the functioning of the SRAM cell 10. All current which flows through transistors 12 and 14 flows from Vcc toward ground. Thus, diodes 30 and 34 are always biased in the forward direction. In other words, the P-N junction contained in these diodes does not act as a block to the flow of current during normal operation of the device.

However, diodes 30 and 34 do cause a voltage drop, typically of approximately 0.7 volts. If Vcc were to have a value of 10 volts or more, this voltage drop would have little effect on the operation of the SRAM cell 10. However, in high density, low voltage integrated circuit parts Vcc is more typically 5 volts or 3.3 volts. At low voltages such as these the 0.7 volt drop across diodes 30 and 34 does have an adverse impact on operation of the SRAM cell 10.

The voltage drop across the diodes is a significant fraction of the total supply voltage. This means that noise margins will be greatly reduced because the full supply voltage cannot be applied across the cell. In addition, this relatively large voltage drop lowers the current available during switching, which slows down the operating speed of the cell.

It would therefor be desirable to provide an interconnect technique for integrated circuits which would eliminate the P-N junction formed when making an electrical connection between active elements on CMOS integrated circuits. It would be further desirable for such a technique to be suitable for use with CMOS SRAM memory circuits. Such an interconnect structure will preferably be easy to implement without additional circuit complexity, and will be compatible with semiconductor process flows widely used in the industry.

SUMMARY OF THE INVENTION

Therefore, according to the present invention, an interconnect structure, and method for forming same, is suitable for use in integrated circuits such as SRAM devices. The structure uses masking of a polycrystalline silicon interconnect level to move a P-N junction to a region within a polycrystalline silicon interconnect line, rather than at the substrate. This P-N junction can then be shorted out using a refractory metal silicide formed on the polycrystalline silicon interconnect structure.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

The process flow shown in FIGS. 2–5 utilizes a twin well CMOS process such as commonly known in the art. As will be appreciated by those skilled in the art, other types of basic CMOS processes can be used in practicing the present invention.

Figure 1:
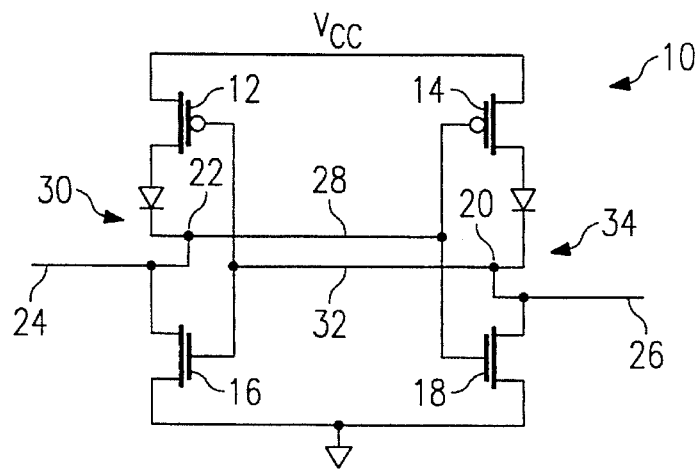
FIG. 1 is a schematic diagram of a portion of an SRAM cell according to the prior art.
Figure 2:
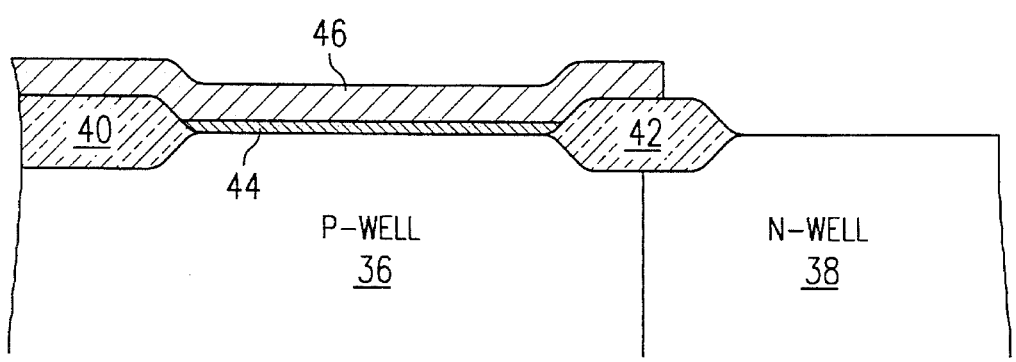
FIGS. 2–5 illustrate a preferred process flow for forming an interconnect in accordance with a preferred embodiment of the present invention.

Referring to FIG. 2, a P-well 36 and N-well 38 are formed in a semiconductor substrate. Field oxide regions 40, 42 are formed to separate active structures for the device. As is known in the art, channel stop regions (not shown) may be formed between the wells under field oxide regions such as field oxide region 42.

A gate oxide layer 44 is grown over the surface of the substrate, followed by formation of a polycrystalline silicon interconnect layer 46. Polycrystalline silicon layer 46 is utilized to form gate electrodes for both N-channel and P-channel transistors. The polycrystalline silicon layer 46 and gate oxide layer 44 are patterned and etched to define the gate electrodes, with a portion of one gate electrode for an N-channel device illustrated overlying P-well 36. As known in the art, gate electrode 46 may be silicided to improve conductivity. In the illustration of FIG. 2, that portion of N-well 38 which is shown constitutes a source or drain region of a P-channel device, with the associated gate electrode not being shown.

Figure 3:
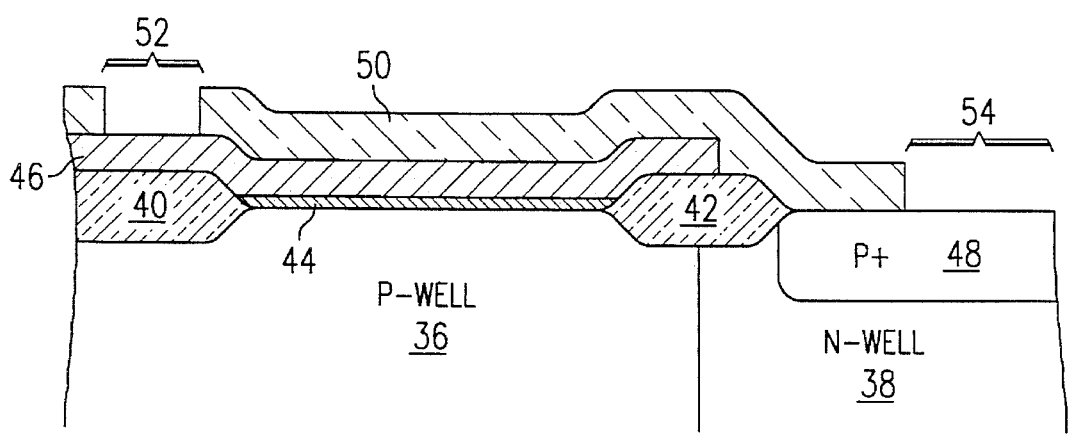

Referring to FIG. 3, both N-type and P-type source and drain implants are made as known in the art. P+ drain 48 is formed in N-well 38 as shown. Highly doped N-type source and drain regions are also formed in P-well 36, but are not shown because the cross-section of the figures is made through the channel of the transistor defined by polycrystalline silicon gate 46. Up to this point, fabrication of the device has been conventional.

An oxide layer 50 is then formed over the device, and patterned and etched to define openings 52 and 54. Oxide layer 50 is not very thick, preferably being formed to a thickness of approximately 500 to 3000 Å.

Figure 4:
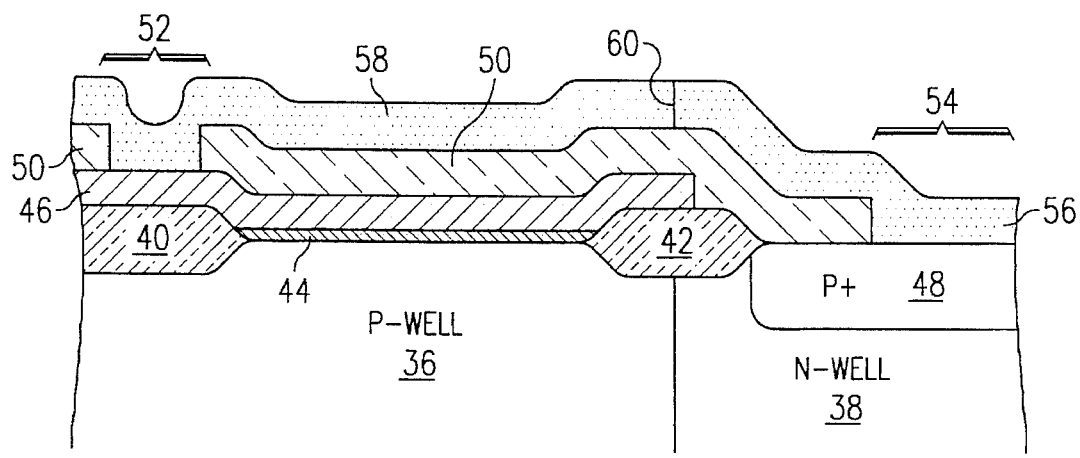

Referring to FIG. 4, a polycrystalline silicon layer is formed over the entire device. Preferably, this polycrystalline silicon layer is undoped, and approximately 1000 Å thick. Two separate masking operations are performed to mask implant of N-type and P-type dopants into the polycrystalline silicon layer. This results in a portion of the layer being doped P-type 56, and the remaining being doped N-type 58. The masks which are used to perform these implants can be the same masks which were used to form the P-well 36 and N-well 38. The N-well 38 mask is used for the P-type implantation, forming P-type polycrystalline silicon region 56, and the P-well 36 mask is used to form the N-type polycrystalline silicon region 58. The formation of these two adjacent conductivity types within the polycrystalline silicon layer gives rise to a P-N junction 60.

If desired, it is possible to deposit the polycrystalline silicon doped with a selected type, and implant only the opposite type of dopant. However, this results in differences in impurity concentrations on either side of the junction 60, which can cause the junction 60 to move. Thus, the preferable approach is to deposit an undoped layer of polycrystalline silicon, followed by heavy implants of P-type and N-type dopants using similar concentrations. Dopant concentrations of approximately $10^{19}$ are suitable for good conductivity.

Figure 5:
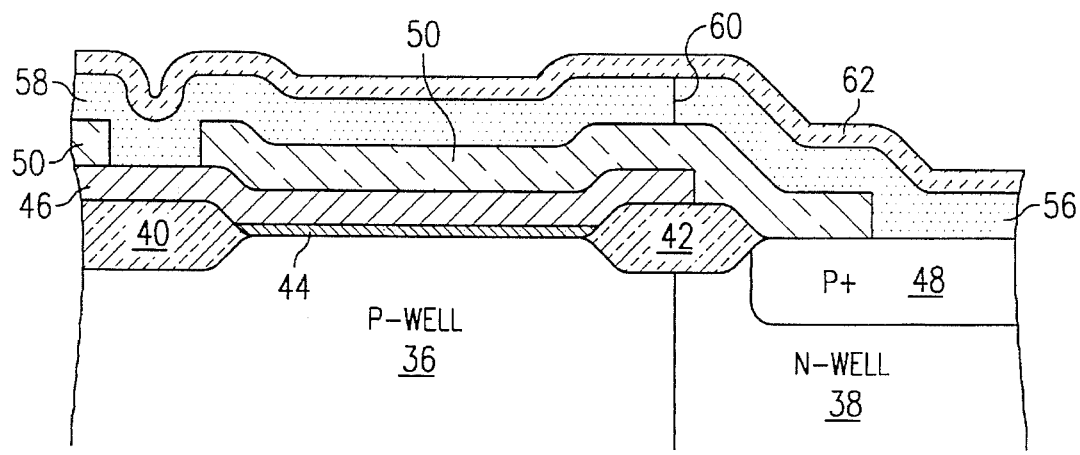

Because the polycrystalline silicon 56 is doped P-type, no P-N junction is formed at the interface between this region 56 and the underlying drain region 48, as would occur in the prior art. As shown in FIG. 5, a layer of refractory metal silicide 62 is formed over the polycrystalline silicon layer. This silicide layer may be formed by direct deposition of silicide, or formation of a refractory metal layer over the polycrystalline silicon followed by silicidation during a thermal heating step. This refractory metal silicide layer 62 serves to improve the overall conductivity of the interconnect formed by the polycrystalline silicon layer, and also shorts out the P-N junction 60 to bypass the diode in the circuit entirely. After formation of the silicide layer 62, the polycrystalline silicon layer, containing N-type region 58 and P-type region 56 is patterned to define interconnect. After this, normal processing of the device continues.

The method just described provides for extra masking steps to dope the polycrystalline silicon interconnect layer, which is often referred to as a local interconnect layer, both P-type and N-type instead of being doped only N-type as is the usual case. This results in moving the P-N junction from the contact up into the polycrystalline silicon, in a location in which it can be shorted out by the formation of the overlying refractory metal silicide layer 62. This eliminates the voltage drop associated with the P-N junction, providing improved performance for the memory cell.

Figure 6:
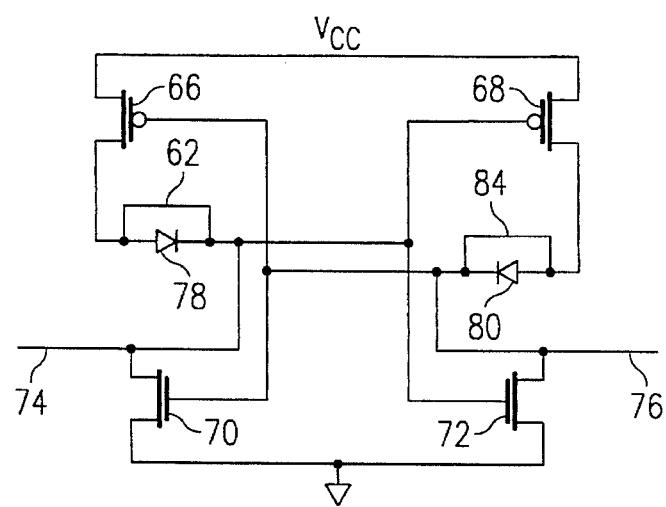
FIG. 6 is a schematic diagram of a portion of an SRAM memory cell formed in accordance with the present invention.

FIG. 6 is a schematic diagram of an SRAM cell formed according to the technique described above. A cell 64 includes P-channel transistors 66 and 68 and N-channel transistors 70 and 72. Signal lines 74, 76 are used to connect to access transistors (not shown). Diodes 78, 80 are those formed as shown by P-N junction 60 in FIGS. 4 and 5, and are shorted out by the refractory metal silicide lines 82, 84. As described above, this results in a cell which does not suffer from the approximately 0.7 volt drop of the diodes inherent in forming a connection between P-type and N-type conductors.

As will be appreciated by those skilled in the art, the process described above for shorting out of the inherent diode is simple to implement, and compatible with overall device fabrication techniques. No extra masks are required to be generated because previously existing masks can be used. The masking steps used for the implants have non-critical tolerances; even a relatively large misplacement of the P-N junction will have no adverse effect. In fact, if the doped regions overlap, or do not make contact, the silicide layer will act to connect them properly with a low resistance layer. If desired, different masks can be used in order to place the junction 60 in a different location; it is only necessary that it be formed in such a manner that the refractory metal silicide layer 62 can short out the junction.

Other variations will become apparent to those skilled in the art. For example, the silicidation process can be performed after the polycrystalline silicon interconnect has been patterned, and still short out the diode. This is easily done by depositing a refractory metal over the circuit after polycrystalline silicon layer 56, 58 has been patterned and etched, and heating the device to cause silicidation. Also, the N-type polycrystalline silicon portion 58 could contact an N-type doped region in the substrate rather than another polycrystalline silicon structure. Other similar variations can take advantage of the teachings herein in a similar manner.

While the invention has been particularly shown and described with reference to a preferred embodiment, it will be understood by those skilled in the art that various changes in form and detail may be made therein without departing from the spirit and scope of the invention.

What is claimed is:

1. An interconnect structure for an integrated circuit, comprising:

a P-type conductive structure;

an N-type conductive structure;

a polycrystalline silicon interconnect element connecting the P-type and N-type conductive structures, wherein the interconnect element is doped N-type in a first region in contact with the N-type conductive structure, and wherein the interconnect element is doped P-type in a second region in contact with the P-type conductive structure; and a conductive layer overlying the interconnect element and in contact with the first and second regions, wherein the conductive layer electrically shorts any P-N junction which exists between the first and second regions.

2. The structure of claim 1, wherein the P-type conductive structure resides in a semiconductor substrate.

3. The structure of claim 2, wherein the P-type conductive structure comprises a drain of a P-channel transistor.

4. The structure of claim 1, wherein the N-type conductive structure comprises a polycrystalline silicon conductive element.

5. The structure of claim 4, wherein the N-type conductive structure comprises a gate of a field effect transistor.

6. The structure of claim 1, wherein the P-type conductive structure comprises a drain of a P-channel load transistor in an SRAM cell, and the N-type conductive structure comprises a polycrystalline silicon gate for a field effect device.

7. The structure of claim 1, wherein the conductive layer comprises a refractory metal silicide.

* * * * *